(12) United States Patent
Lee

(10) Patent No.: US 11,043,507 B2
(45) Date of Patent: Jun. 22, 2021

(54) DEVICES INCLUDING DUMMY REGIONS, AND RELATED MEMORY DEVICES AND ELECTRONIC SYSTEMS

(71) Applicant: Micron Technology, Inc., Boise, ID (US)

(72) Inventor: Eric N. Lee, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/554,943

(22) Filed: Aug. 29, 2019

(65) Prior Publication Data

US 2020/0066752 A1    Feb. 27, 2020

Related U.S. Application Data

(63) Continuation of application No. 16/106,752, filed on Aug. 21, 2018, now Pat. No. 10,580,791.

(51) Int. Cl.

| | |
|---|---|
| *H01L 27/11582* | (2017.01) |
| *H01L 27/11548* | (2017.01) |
| *H01L 27/11556* | (2017.01) |
| *G11C 11/4097* | (2006.01) |
| *G11C 11/419* | (2006.01) |
| *H01L 29/66* | (2006.01) |

(52) U.S. Cl.
CPC .... *H01L 27/11582* (2013.01); *G11C 11/4097* (2013.01); *G11C 11/419* (2013.01); *H01L 27/11548* (2013.01); *H01L 27/11556* (2013.01); *H01L 29/66545* (2013.01)

(58) Field of Classification Search
CPC ......... H01L 27/11582; H01L 27/11548; H01L 27/11556; G11C 11/4097; G11C 11/419
See application file for complete search history.

(56) References Cited

U.S. PATENT DOCUMENTS

| | | |
|---|---|---|
| 5,107,459 A | 4/1992 | Chu et al. |
| 6,734,482 B1 | 5/2004 | Tran et al. |
| 7,570,525 B2 | 8/2009 | Nii et al. |
| 8,704,205 B2 | 4/2014 | Chen et al. |
| 9,224,747 B2 | 12/2015 | Mizutani et al. |
| 9,449,987 B1 | 9/2016 | Miyata et al. |
| 9,748,258 B2 | 8/2017 | Jeong et al. |

(Continued)

*Primary Examiner* — Kyoung Lee
*Assistant Examiner* — Christina A Sylvia
(74) *Attorney, Agent, or Firm* — TraskBritt

(57) ABSTRACT

A semiconductor device structure comprises blocks having substantially uniform pitch laterally-extending throughout a first region, a second region laterally-neighboring the first memory region, and a third region laterally-neighboring the second region; memory strings longitudinally-extending through a first portion of the blocks located in the first region; pillar structures longitudinally-extending through a second portion of the blocks located in the second region; conductive contacts longitudinally-extending through a third portion of the blocks located in the third region; and conductive line structures electrically coupled to and laterally-extending between the memory strings and the conductive contacts. Each of the blocks comprises tiers, each tier comprising a conductive structure and an insulating structure longitudinally-neighboring the conductive structure. Semiconductor devices and electronic systems are also described.

20 Claims, 5 Drawing Sheets

(56) References Cited

U.S. PATENT DOCUMENTS

| | | |
|---|---|---|
| 9,881,924 B2 | 1/2018 | Wang et al. |
| 2006/0077737 A1 | 4/2006 | Ooishi |
| 2008/0277713 A1 | 11/2008 | Maekawa |
| 2009/0310415 A1 | 12/2009 | Jin et al. |
| 2010/0090286 A1 | 4/2010 | Lee et al. |
| 2010/0133598 A1 | 6/2010 | Chae et al. |
| 2010/0133599 A1* | 6/2010 | Chae ................ H01L 27/11565 257/315 |
| 2010/0165693 A1 | 7/2010 | Ohgami |
| 2010/0207190 A1* | 8/2010 | Katsumata ......... G11C 16/0483 257/319 |
| 2011/0316072 A1 | 12/2011 | Lee |
| 2012/0007167 A1 | 1/2012 | Hung et al. |
| 2012/0307545 A1 | 12/2012 | McAdams et al. |
| 2013/0223142 A1 | 8/2013 | Park et al. |
| 2014/0233315 A1 | 8/2014 | Park et al. |
| 2015/0001613 A1 | 1/2015 | Yip et al. |
| 2015/0115348 A1* | 4/2015 | Nam .................. H01L 29/7926 257/324 |
| 2016/0181269 A1 | 6/2016 | Lai et al. |
| 2017/0256551 A1 | 9/2017 | Lee |
| 2018/0019245 A1 | 1/2018 | Yang et al. |
| 2018/0261616 A1* | 9/2018 | Cho .................. H01L 27/11582 |

\* cited by examiner

DEVICES INCLUDING DUMMY REGIONS, AND RELATED MEMORY DEVICES AND ELECTRONIC SYSTEMS

CROSS-REFERENCE TO RELATED APPLICATION

This application is a continuation of U.S. patent application Ser. No. 16/106,752, filed Aug. 21, 2018, now U.S. Pat. No. 10,580,791, issued Mar. 3, 2020, the disclosure of which is hereby incorporated herein in its entirety by this reference.

TECHNICAL FIELD

The disclosure, in various embodiments, relates generally to the field of semiconductor device design and fabrication. More specifically, the disclosure relates to semiconductor device structures including data line contact regions, and to related semiconductor devices and electronic systems.

BACKGROUND

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in tiers of conductive structures (e.g., word lines, control gates) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

In a conventional 3D memory device structure, data lines (e.g., bit lines, digit lines) are electrically coupled to vertical memory strings of a vertical memory array, and an opening is provided next to edges of the vertical memory array to accommodate data line contacts for each of the data lines. The data line contacts electrically couple the data lines to control logic circuitry to facilitate operations (e.g., read operations, write operations, erase operations) on the vertical memory strings of the vertical memory array. However, providing the opening for the data line contacts next to the vertical memory array can effectuate damage to and/or defects at the edges of the vertical memory array (e.g., commonly referred to as "array edge effects"). Accordingly, an array of "dummy" pillars (e.g., dielectric pillars) is conventionally provided between the vertical memory array and the opening to set the edges of the vertical memory array back farther from the opening and mitigate the aforementioned damage to and/or defects at the edges of the vertical memory array. Unfortunately, the area conventionally required for such an opening and such an array of dummy pillars can frustrate improvements in overall lateral dimensions and packing density in such 3D memory device structures.

Accordingly, there is a need for 3D semiconductor device structures exhibiting improved packing density, such as memory device structures for 3D non-volatile memory devices (e.g., 3D NAND Flash memory devices), as well as for associated semiconductor devices and electronic systems including the semiconductor device structures.

DETAILED DESCRIPTION

Figure 1A:
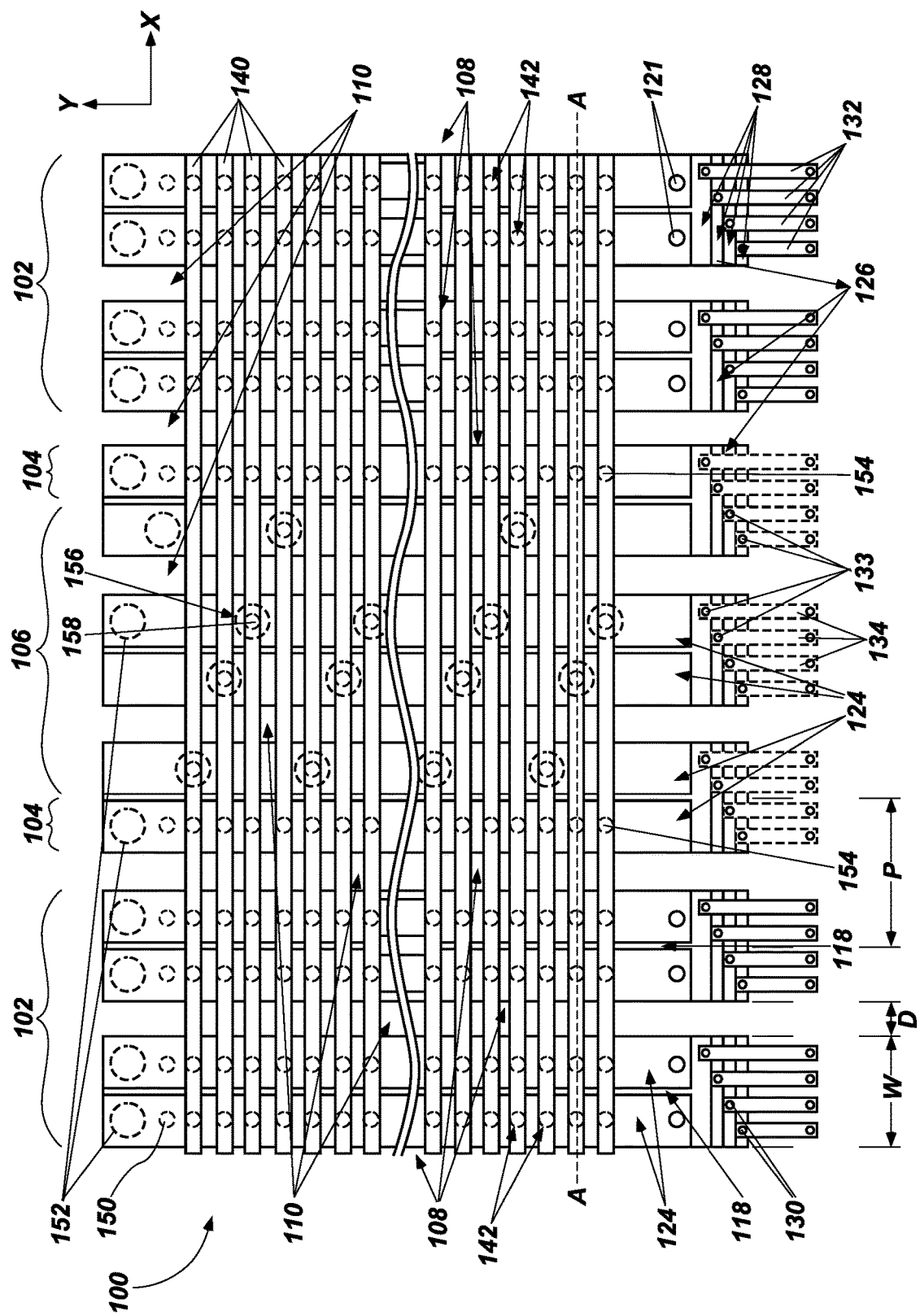
FIG. 1A is a simplified, partial top-down view of a semiconductor device structure, in accordance with embodiments of the disclosure.

Semiconductor device structures are described, as are related semiconductor devices and electronic systems. In some embodiments, a semiconductor device structure includes one or more memory regions, at least one data line (e.g., bit line, digit line) contact region, and one or more dummy regions laterally intervening between the memory regions and the data line contact region. An array of blocks laterally extends through each of the memory regions, the dummy regions, and the data line contact region. The blocks of the array are all oriented substantially parallel to one another (e.g., each extend in a first lateral direction), and neighboring blocks of the array are laterally separated (e.g., in a second lateral direction orthogonal to the first lateral direction) from one another by slots (e.g., openings, trenches). Each of the blocks includes tiers each individually comprising a conductive structure and an insulating structure vertically-neighboring the conductive structure. In addition, each block of the array exhibits substantially the same geometric configurations (e.g., dimensions, shape) and lateral separation (e.g., corresponding to the width of each of the slots) from laterally-neighboring blocks of the array. Accordingly, the blocks are substantially uniformly (e.g., non-variably, equally, consistently) sized, shaped, and spaced throughout the memory regions, the dummy regions, and the data line contact region. Memory strings vertically-extend through blocks of the array at least partially located within the memory regions, dummy pillars vertically-extend through blocks of the array at least partially located within the dummy regions, and through vias (e.g., through openings, through apertures) at least partially filled with data line contacts vertically-extend through blocks of the array at least partially located within the data line contact region. In addition, data lines are electrically coupled to and laterally-extend between the memory strings and the data line contacts. The semiconductor device structures, semiconductor devices, and electronic systems of the disclosure may facilitate increased simplicity, efficiency, yield, and packing density relative to conventional semiconductor device structures, conventional semiconductor devices, and conventional electronic systems.

The following description provides specific details, such as material compositions and processing conditions, in order to provide a thorough description of embodiments of the present disclosure. However, a person of ordinary skill in the art would understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device (e.g., a memory device). The semiconductor device structures described below do not form a complete semiconductor device. Only those process acts and structures necessary to understand the embodiments of the present disclosure are described in detail below. Additional acts to form a complete semiconductor device from the semiconductor device structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. As used herein, "vertically-neighboring" or "longitudinally-neighboring" features (e.g., regions, structures, devices) means and includes features located most vertically proximate (e.g., vertically closest) one another. In addition, as used herein, "horizontally-neighboring" or "laterally-neighboring" features (e.g., regions, structures, devices) means and includes features located most horizontally proximate (e.g., horizontally closest) one another.

As used herein, the term "pitch" refers to the distance between identical points in two neighboring features.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct ohmic connection or through an indirect connection (e.g., via another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Figure 1B:
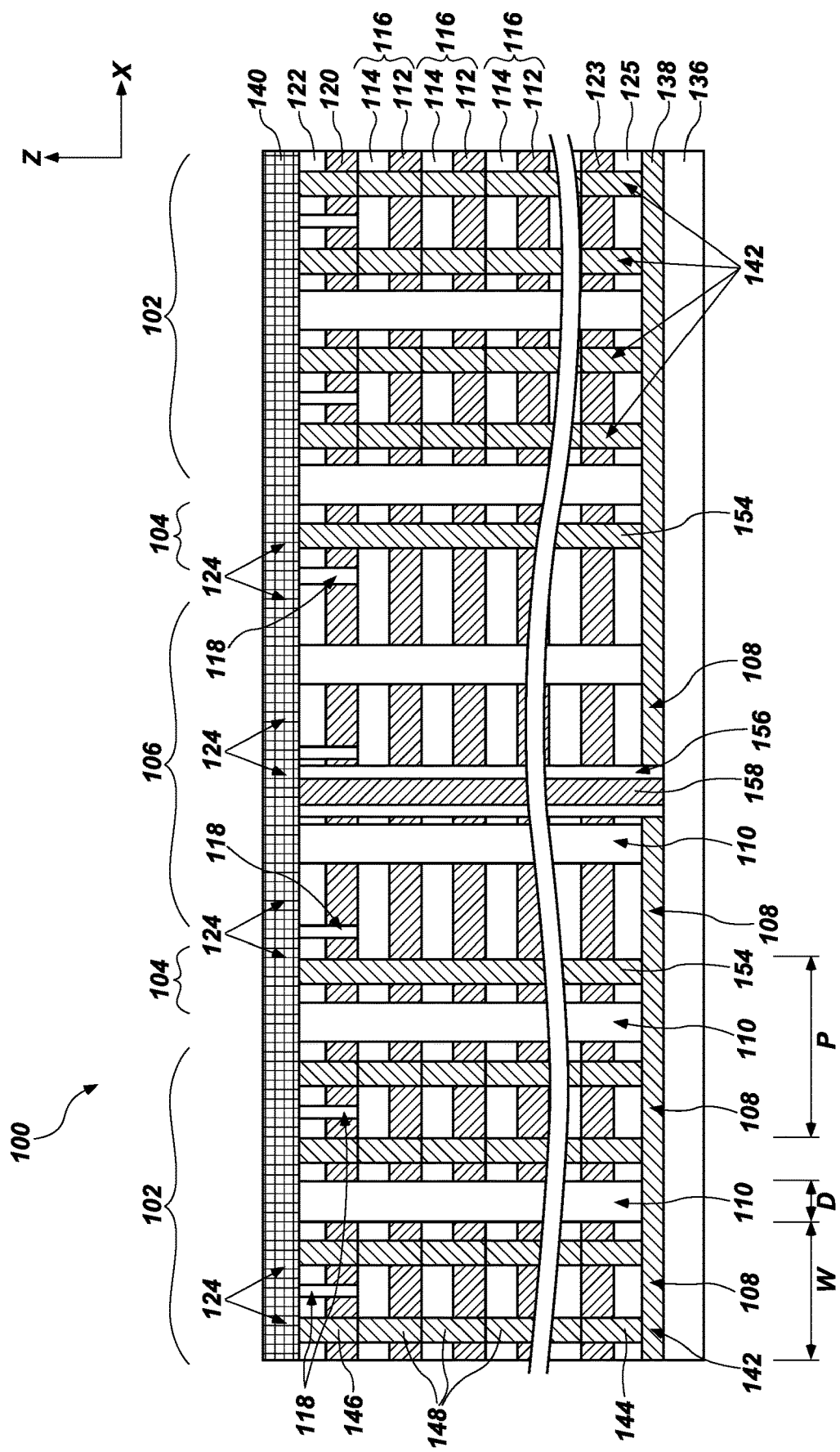
FIG. 1B is a simplified, partial cross-sectional view of the semiconductor device structure shown in FIG. 1A.
Figure 1C:
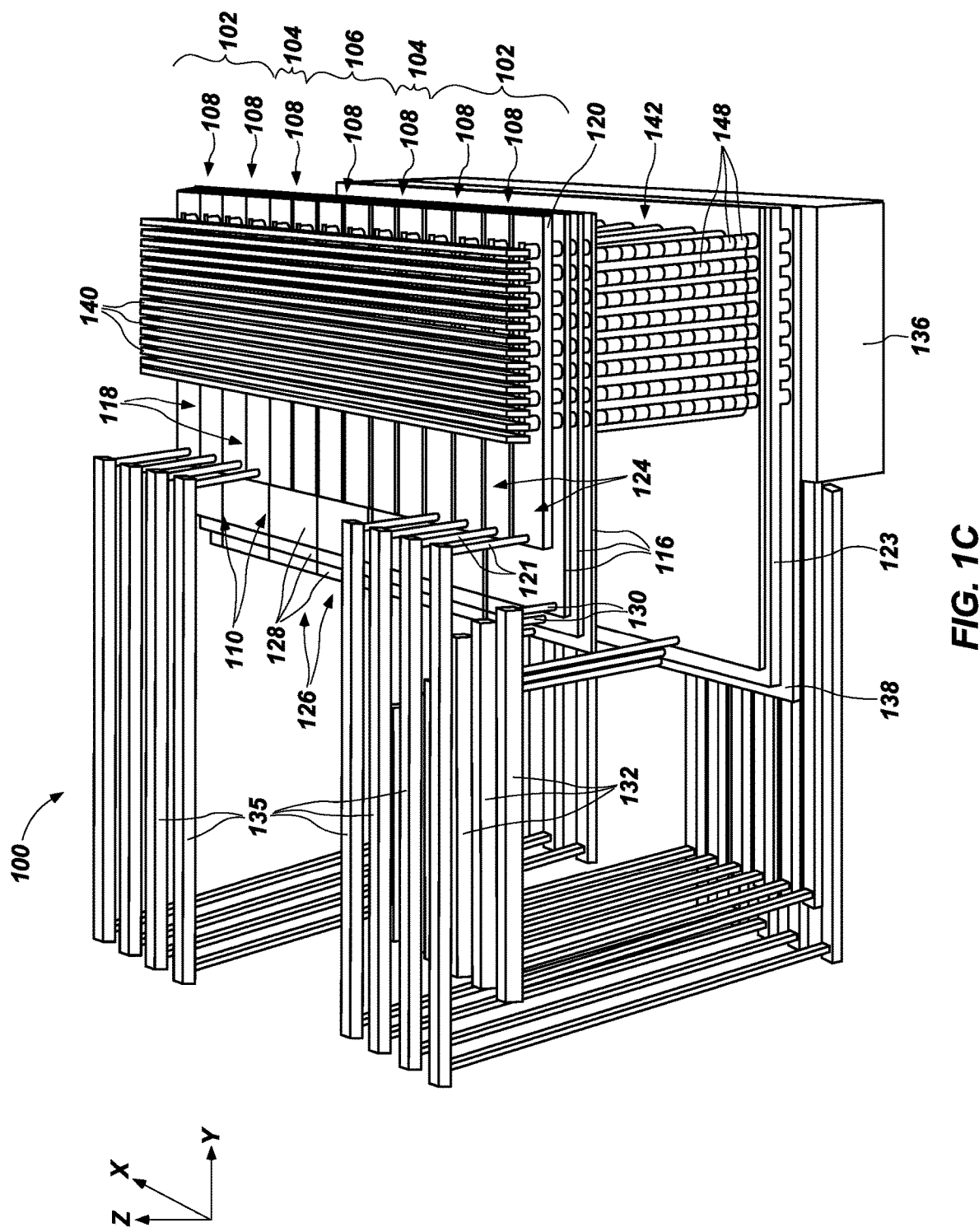
FIG. 1C is a simplified, partial cutaway perspective view of the semiconductor device structure shown in FIG. 1A.

FIG. 1A shows a simplified, partial top-down view of a semiconductor device structure 100 of a semiconductor device (e.g., a memory device, such as a 3D NAND Flash memory device), in accordance with embodiments of the disclosure. The semiconductor device structure 100 includes one or more memory regions 102, one or more dummy regions 104 laterally-neighboring the memory regions 102, and at least one data line (e.g., bit line, digit line) contact region 106 laterally-neighboring the dummy regions 104. In some embodiments, the semiconductor device structure 100 includes a pair of (e.g., two) memory regions 102, a pair of (e.g., two) dummy regions 104 inwardly laterally-neighboring the pair of memory regions 102, and a single (e.g., only one) data line contact region 106 inwardly laterally-neighboring the pair of dummy regions 104. FIG. 1B is a simplified, partial cross-sectional view of the semiconductor device structure 100 about the line A-A shown in FIG. 1A. FIG. 1C is a simplified, partial cutaway perspective view of the semiconductor device structure 100 shown in FIG. 1A. For clarity and ease of understanding of the drawings and related description, not all features depicted in one of FIGS. 1A through 1C are depicted in each other of FIGS. 1A through 1C.

Referring to FIG. 1A, the semiconductor device structure 100 includes an array of blocks 108 laterally-extending throughout the memory regions 102, the dummy regions 104, and the data line contact region 106. The blocks 108 of the array laterally extend in substantially the same direction (e.g., in the Y-direction) as one another, such that all of the blocks 108 are oriented substantially parallel to one another. In addition, neighboring blocks 108 of the array are laterally separated (e.g., in the X-direction) from one another by slots 110 (e.g., openings, trenches), such that the semiconductor device structure 100 exhibits a laterally alternating pattern of the blocks 108 and the slots 110.

Each of the blocks 108 may exhibit substantially the same width W (e.g., lateral dimension in the X-direction) as one another. In addition, each of the blocks 108 may be separated (e.g., in the X-direction) from each other laterally-neighboring block 108 by substantially the same distance D (e.g., corresponding to the width of each of the slots 110), such that the blocks 108 are substantially uniformly spaced throughout the different regions (e.g., the memory regions 102, the dummy regions 104, and the data line contact region 106) of the semiconductor device structure 100. Accordingly, a pitch P between centerlines of laterally-neighboring blocks 108 may be substantially uniform throughout the different regions (e.g., the memory regions 102, the dummy regions 104, and the data line contact region 106) of the semiconductor device structure 100.

For clarity and ease of understanding of the drawings and related description, FIG. 1A shows the semiconductor device structure 100 as including seven (7) of the blocks 108 and six (6) of the slots 110. The memory regions 102 each individually include two (2) of the blocks 108, another two (2) of the blocks 108 are shared between the dummy regions 104 and the data line contact region 106, and another one (1) of the blocks 108 is entirely located within the data line contact region 106. However, the semiconductor device structure 100 may include different quantities (e.g., amounts, numbers) of the blocks 108 (e.g., greater than seven (7) of the blocks 108, less than seven (7) of the blocks 108) and the slots 110 (e.g., greater than six (6) of the slots 110, less than six (6) of the slots 110), and/or may include a different distribution of the blocks 108 (and, hence, the slots 110) within the different regions thereof. The quantities of blocks 108 and slots 110 included in the semiconductor device structure 100 (including each of the memory regions 102, the dummy regions 104, and the data line contact region 106 thereof) at least partially depends on the quantities, dimensions, and arrangements of additional structures included in the different regions of the semiconductor device structure 100, as described in further detail below.

Referring to FIG. 1B, each of the blocks 108 of the semiconductor device structure 100 (including the blocks 108 located in each of the memory regions 102, the dummy regions 104, and the data line contact region 106) includes a longitudinally (e.g., vertically) alternating sequence of conductive structures 112 (e.g., word line plates) and insulating structures 114 arranged in tiers 116. Each of the tiers 116 may include one (1) of the conductive structures 112 longitudinally-neighboring one of the insulating structures 114. Each of the blocks 108 of the semiconductor device structure 100 may include a desired quantity of the tiers 116, such as greater than or equal to two (2) of the tiers 116, greater than or equal to five (5) of the tiers 116, greater than or equal to ten (10) of the tiers 116, greater than or equal to twenty-five (25) of the tiers 116, greater than or equal to fifty (50) of the tiers 116, greater than or equal to one hundred (100) of the tiers 116) of the conductive structures 112 and insulating structures 114.

The conductive structures 112 of the tiers 116 of each of the blocks 108 of the semiconductor device structure 100 may be formed of and include at least one conductive material, such as a conductively-doped semiconductor material (e.g., conductively-doped polysilicon, conductively-doped germanium, conductively-doped silicon germanium), a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), or combinations thereof. In some embodiments, the conductive structures 112 are formed of and include conductively-doped polysilicon. In additional embodiments, the conductive structures 112 are formed of and include a metallic material (e.g., a metal, such as tungsten; an alloy). Each of the conductive structures 112 may individually include a substantially homogeneous distribution or a substantially heterogeneous distribution of the at least one conductive material. As used herein, the term "homogeneous distribution" means amounts of a material do not vary throughout different portions (e.g., different lateral portions, different longitudinal portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the conductive structures 112 of each of the tiers 116 of each of the blocks 108 of the semiconductor device structure 100 exhibits a substantially homogeneous distribution of conductive material. In additional embodiments, at least one of the conductive structures 112 of at least one of the tiers 116 of each of the blocks 108 of the semiconductor device structure 100 exhibits a substantially heterogeneous distribution of at least one conductive material. The conductive structure 112 may, for example, be formed of and include a stack of at least two different conductive materials. The conductive structures 112 of each of the tiers 116 of each of the blocks 108 of the semiconductor device structure 100 may each be substantially planar, and may each exhibit any desired thickness.

The insulating structures 114 of the tiers 116 of each of the blocks 108 of the semiconductor device structure 100 may be formed of and include at least one insulating material, such as an oxide material (e.g., silicon dioxide, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or a combination thereof), a nitride material (e.g., silicon nitride), an oxynitride material (e.g., silicon oxynitride), amorphous carbon, or a combination thereof. In some embodiments, the insulating structures 114 are formed of and include silicon dioxide. Each of the insulating structures 114 may individually include a substantially homogeneous distribution or a substantially heterogeneous distribution of the at least one insulating material. In some embodiments, each of the insulating structures 114 of each of the tiers 116 of each of the blocks 108 of the semiconductor device structure 100 exhibits a substantially homogeneous distribution of insulating material. In additional embodiments, at least one of the insulating structures 114 of at least one of the tiers 116 of each of the blocks 108 of the semiconductor device structure 100 exhibits a substantially heterogeneous distribution of at least one conductive material. The insulating structure 114 may, for example, be formed of and include a stack (e.g., laminate) of at least two different insulating materials. The insulating structures 114 of each of the tiers 116 of each of the blocks 108 of the semiconductor device structure 100 may each be substantially planar, and may each individually exhibit any desired thickness.

The longitudinally alternating sequence of conductive structures 112 and insulating structures 114 of each of the blocks 108 of the semiconductor device structure 100 may be formed through conventional processes (e.g., conventional material deposition processes, conventional material removal processes), which are not described in detail herein. As a non-limiting example, a preliminary stack structure including a longitudinally alternating sequence of sacrificial structures and preliminary insulating structures may be formed through conventional material deposition processes (e.g., one or more of in situ growth, spin-on coating, blanket coating, chemical vapor deposition (CVD), plasma enhanced chemical vapor deposition (PECVD), atomic layer deposition (ALD), and physical vapor deposition (PVD)); the slots 110 may be formed through at least the preliminary stack structure by way of one or more material removal (e.g., masking and etching) processes to form modified sacrificial structures and the insulating structures 114; at least a portion of each of the modified sacrificial structures may be selectively removed by way of one or more additional material removal (e.g., an isotropic etching) processes to form recessed regions; and then the recessed regions may be at least partially (e.g., substantially) filled with conductive material to form the conductive structures 112.

With continued reference to FIG. 1B, each of the blocks 108 of the semiconductor device structure 100 (including the blocks 108 located in each of the memory regions 102, the dummy regions 104, and the data line contact region 106) may further include at least one shallow slot 118 (e.g., shallow opening, shallow trench) longitudinally extending into the block 108 from an upper surface thereof. The shallow slot 118 may downwardly longitudinally extend (e.g., in the negative Z-direction) through upper materials of each of the blocks 108 to define upper select gates 120 (e.g., drain select gates (SGDs)) for each of the blocks 108, and upper insulating structures 122 overlying the upper select gates 120. The upper select gates 120 may each be formed of and include at least one conductive material, and the upper insulating structures 122 may each be formed of and include at least one insulating material. In some embodiments, each of the blocks 108 includes two (2) of the upper select gates 120, and a single (i.e., only one) shallow slot 118 laterally intervening (e.g., in the X-direction) between the two (2) of the upper select gates 120. In additional embodiments, each of the blocks 108 includes a different quantity (e.g., number, amount) of the upper select gates 120 (e.g., more than two (2) of the upper select gates 120) and a different quantity of the shallow slots 118 (e.g., more than one (1) of the shallow slots 118). Referring collectively to FIGS. 1A through 1C, within at least the memory regions 102 of the semiconductor device structure 100, the upper select gates 120 (FIGS. 1B and 1C) may be electrically coupled to select lines 135 (FIG. 1C) of the semiconductor device structure 100 by way of vertical select gate contact structures 121 (FIGS. 1A and 1C). The upper select gates 120 of the dummy regions 104 and the data line contact region 106 may be free of vertical select gate contact structures 121 connected thereto, such that the upper select gates 120 of the dummy regions 104 and the data line contact region 106 are not electrically coupled to select lines 135 of the semiconductor device structure 100. The quantity of upper select gates 120 included in each of the blocks 108 may directly correspond to (e.g., be the same as) a quantity of sub-blocks 124 included in each of the blocks 108. By way of non-limiting example, as shown in FIG. 1B, each of the blocks 108 may include two (2) upper select gates 120 and, therefore, two (2) corresponding sub-blocks 124.

Referring to FIG. 1B, each of the blocks 108 of the semiconductor device structure 100 (including the blocks 108 located in each of the memory regions 102, the dummy regions 104, and the data line contact region 106) may also include a lower select gate 123 (e.g., a source select gate (SGS)) and a lower insulating structure 125 underlying the lower select gate 123. The lower select gate 123 and the lower insulating structure 125 of each of the blocks 108 of the semiconductor device structure 100 may longitudinally underlie the tiers 116 of conductive structures 112 and insulating structures 114 of each of the blocks 108. The lower select gates 123 may each be formed of and include at least one conductive material, and the lower insulating structures 125 may each be formed of and include at least one insulating material. In some embodiments, each of the blocks 108 includes a single (only one) lower select gate 123. Within at least the memory regions 102 of the semiconductor device structure 100, the lower select gates 123 may be electrically coupled to additional select lines of the semiconductor device structure 100.

With returned reference to FIG. 1A, each of the blocks 108 of the semiconductor device structure 100 (including the blocks 108 located in each of the memory regions 102, the dummy regions 104, and the data line contact region 106) may include a staircase structure 126 at a lateral end (e.g., in the Y-direction) thereof. The staircase structure 126 of each of the blocks 108 includes steps 128 at least partially defined by exposed portions of the tiers 116 (FIG. 1B) of conductive structures 112 and insulating structures 114 of the block 108. The quantity of steps 128 included in each of the staircase structures 126 of each of the blocks 108 may be substantially the same as (e.g., equal to) or may be different than (e.g., less than, greater than) the quantity of tiers 116 (FIG. 1B) in each the blocks 108. The steps 128 of the staircase structures 126 may serve as contact regions to electrically couple the conductive structures 112 (FIG. 1B) of the tiers 116 (FIG. 1B) to one or more other structures of the semiconductor device structure 100. For example, as shown in FIG. 1A, at least for the blocks 108 within the memory regions 102 of the semiconductor device structure 100, vertical conductive contact structures 130 may be coupled to the conductive structures 112 (FIG. 1B) of the tiers 116 (FIG. 1B) of the blocks 108 at the steps 128 of the staircase structures 126, and may electrically couple the conductive structures 112 (FIG. 1B) to access lines 132 (e.g., word lines) of the semiconductor device structure 100. Optionally, as also shown in FIG. 1A, the blocks 108 at least partially located within the data line contact region 106 and/or the dummy regions 104 of the semiconductor device structure 100 may include additional vertical conductive contact structures 133 coupled to the conductive structures 112 (FIG. 1B) of the tiers 116 (FIG. 1B) of the blocks 108 at the steps 128 of the staircase structures 126. If present, the additional vertical conductive contact structures 133 may electrically couple the conductive structures 112 (FIG. 1B) to additional conductive lines 134 of the semiconductor device structure 100. In turn, the additional conductive lines 134 may be electrically connected to a discharging circuit to ground or float the tiers 116 of the blocks 108 within the data line contact region 106 and/or the dummy regions 104.

Referring again to FIG. 1B, each of the blocks 108 of the semiconductor device structure 100 (including the blocks 108 located in each of the memory regions 102, the dummy regions 104, and the data line contact region 106) may be substantially the same as one another with respect to the outermost dimensions (e.g., outermost lateral dimensions, outermost longitudinal dimensions) and the arrangements of at least the tiers 116 (including the conductive structures 112 and the insulating structures 114 thereof), the upper select gates 120 (and, hence, the shallow slots 118), the lower select gates 123, and the staircase structures 126 (including the steps 128 thereof) thereof. In addition, each of the blocks 108 of the semiconductor device structure 100 may also be substantially the same as one another with respect to the quantity and outermost dimensions (e.g., outermost lateral dimensions, outermost longitudinal dimensions) of the sub-blocks 124 thereof. With continued reference to FIG. 1B, the semiconductive device structure 100 further includes at least one control logic structure 136, at least one source line 138 (e.g., a common source line (CSL)), and data lines 140 (e.g., bit lines, digit lines). The source line 138 may longitudinally overlie the control logic structure 136, and the data lines 140 may longitudinally overlie the source line 138. In additional embodiments, the control logic structure 136 may longitudinally overlie the source line 138 and the data lines 140. As shown in FIG. 1B, the blocks 108 of the semiconductive device structure 100 may longitudinally overlie the source line 138, and may longitudinally underlie the data lines 140. The blocks 108 and the slots 110 of the semiconductor device structure 100 may each substantially longitudinally extend between the source line 138 and the data lines 140.

The control logic structure 136 may include devices and circuitry for controlling various operations of other components of the semiconductive device structure 100. By way of non-limiting example, the control logic structure 136 may include one or more (e.g., each) of charge pumps (e.g., $V_{CCP}$ charge pumps, $V_{NEGWL}$ charge pumps, DVC2 charge pumps); delay-locked loop (DLL) circuitry (e.g., ring oscillators); drain supply voltage ($V_{dd}$) regulators; devices and circuitry for controlling column operations for arrays (e.g., arrays of vertical memory strings) within the memory regions 102 of the semiconductor device structure 100, such as one or more (e.g., each) of decoders (e.g., column decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry), I/O devices (e.g., local I/O devices), memory test devices, array multiplexers (MUX), and error checking and correction (ECC) devices; and devices and circuitry for controlling row operations for arrays (e.g., arrays of vertical memory strings) within the memory regions 102 of the semiconductor device structure 100, such as one or more (e.g., each) of decoders (e.g., row decoders), drivers (e.g., word line (WL) drivers), repair circuitry (e.g., row repair circuitry), memory test devices, MUX, ECC devices, and self-refresh/wear leveling devices. The control logic structure 136 may be electrically coupled to the access lines 132 (FIGS. 1A and 1C), the additional conductive lines 134 (if any) (FIG. 1A), the source line 138, the data lines 140, the upper select gates 120, and the lower select gates 123 of the semiconductive device structure 100, as described in further detail below.

The source line 138 may comprise one or more conductive materials, such as a conductively-doped semiconductor material (e.g., conductively-doped polysilicon, conductively-doped germanium, conductively-doped silicon germanium), a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), or combinations thereof. The source line 138 is in electrical communication with control logic structure 136 and arrays (e.g., arrays of memory strings) within the memory regions 102 of the semiconductor device structure 100 to facilitate operations (e.g., read operations, write operations, erase operations) on the arrays.

The data lines 140 may also comprise one or more conductive materials, such as a conductively-doped semiconductor material (e.g., conductively-doped polysilicon, conductively-doped germanium, conductively-doped silicon germanium), a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), or combinations thereof. The data lines 140 are in electrical communication with arrays (e.g., arrays of memory strings) within the memory regions 102 of the semiconductor device structure 100, and are also be in electrical communication with the control logic structure 136 through additional arrays (e.g., arrays of data line contacts) within the data line contact region 106 of the semiconductor device structure 100, as described in further detail below.

With continued reference to FIG. 1B, the memory regions 102 of the semiconductive device structure 100 include memory strings 142 longitudinally extending (e.g., in the Z-direction) through the blocks 108 thereof. The memory strings 142 may substantially longitudinally extend between the source line 138 and the data lines 140. As shown in FIG. 1B, each of the memory strings 142 may include a lower select transistor 144, an upper select transistor 146, and memory cells 148 (e.g., each including a memory cell transistor and a memory cell element) connected in series between the lower select transistor 144 and the upper select transistor 146. The lower select transistors 144 of the memory strings 142 may be electrically coupled to the source line 138 and the lower select gates 123 of the blocks 108 within the memory regions 102 of the semiconductive device structure 100. The upper select transistors 146 may be electrically coupled to the data lines 140 and the upper select gates 120 of the blocks 108 within the memory regions 102 of the semiconductive device structure 100. The memory cells 148 may be electrically coupled to the conductive structures 112 (e.g., word line plates) of the blocks 108 within the memory regions 102 of the semiconductive device structure 100 (and, hence, may also be electrically coupled to the access lines 132 (FIGS. 1A and 1C) of the semiconductive device structure 100 by way of the vertical conductive contact structures 130 (FIG. 1A) electrically coupled to the steps 128 (FIG. 1A) of the staircase structures 126 of the blocks 108 within the memory regions 102).

Each of the blocks 108 within the memory regions 102 of the semiconductive device structure 100 may include any desired quantity and distribution of the memory strings 142. As shown in FIG. 1A, in some embodiments, each of the sub-blocks 124 of each of the blocks 108 within the memory regions 102 of the semiconductive device structure 100 includes a single (e.g., only one) column of the memory strings 142 laterally extending in the Y-direction. In additional embodiments, each of the blocks 108 within the memory regions 102 of the semiconductive device structure 100 includes a different quantity of the memory strings 142 than that depicted in FIG. 1A, and/or a different distribution of the memory strings 142 than that depicted in FIG. 1A. For example, each of the sub-blocks 124 of each of the blocks 108 within the memory regions 102 of the semiconductive device structure 100 may include multiple (e.g., more than one (1), such as two (2), three (3), four (4), or more than four (4)) columns of the memory strings 142 laterally extending in the Y-direction.

As shown in FIG. 1A, the memory regions 102 of the semiconductive device structure 100 may also include one or more of dummy structures 150 (e.g., dummy pillars) and edge support structures 152 (e.g., edge support pillars) longitudinally extending (e.g., in the Z-direction shown in FIG. 1B) through the blocks 108 thereof. If present, the dummy structures 150 and/or the edge support structures 152 may substantially longitudinally extend through the blocks 108 of the memory regions 102 of the semiconductive device structure 100. The dummy structures 150 (if any) may be formed of and include one or more materials (e.g., dielectric materials, semiconductive materials) able to alleviate undesirable array edge effects for the arrays of the memory strings 142 within each of the blocks 108 of the memory regions 102. In some embodiments, the dummy structures 150 comprise dielectric structures. In some embodiments, the dummy structures 150 comprise semiconductive structures. In further embodiments, the dummy structures 150 comprise inactive memory strings (e.g., memory strings that are not electrically connected to the data lines 140). The edge support structures 152 (if any) may be formed of and include one or more materials (e.g., dielectric materials, semiconductive materials) able to support edge portions of the tiers 116 (FIG. 1B) of conductive structures 112 and insulating structures 114 within each of the blocks 108 of the memory regions 102.

For clarity and ease of understanding of the drawings and related description, FIG. 1A shows the semiconductor device structure 100 as including two (2) memory regions 102, each including two (2) blocks 108 exhibiting arrays of the memory strings 142 longitudinally extending therethrough. However, the semiconductor device structure 100 may include a different quantity of memory regions 102 (e.g., only one (1) memory region 102, more than two (2) memory regions 102), and/or one or more of the memory regions 102 may include a different quantity of blocks 108 (e.g., only one (1) block 108, more than two (2) blocks 108) therein. The quantity of memory regions 102 and quantity of blocks 108 included in each of the memory regions 102 may at least partially depend on the quantity of memory strings 142 included in the semiconductor device structure 100 (e.g., a relatively greater quantity of memory strings 142 may effectuate a relatively greater quantity of memory regions 102 and/or blocks 108 within the memory regions 102).

With returned reference to FIG. 1B, the dummy regions 104 of the semiconductive device structure 100 may laterally neighbor (e.g., in the X-direction) the memory regions 102, and may include dummy pillars 154 longitudinally extending (e.g., in the Z-direction) through portions of the blocks 108 located therein. The dummy pillars 154 may substantially longitudinally extend between the source line 138 and the data lines 140, and may be formed of and include one or more dielectric materials. The dummy pillars 154 may be may be employed to alleviate undesirable array edge effects for arrays of the memory strings 142 within the blocks 108 of the memory regions 102 laterally-neighboring the dummy regions 104.

Portions of the blocks 108 within the dummy regions 104 of the semiconductive device structure 100 may include any desired quantity and distribution of the dummy pillars 154. In some embodiments, each of the dummy regions 104 shares one of the blocks 108 of the semiconductive device structure 100 with the data line contact region 106 of the semiconductive device structure 100, such that one of the sub-blocks 124 of the block 108 is located within the dummy region 104 and includes dummy pillars 154 longitudinally extending therethrough, and the other of the sub-blocks 124 of the block 108 is located within the data line contact region 106 and is free of the dummy pillars 154. As shown in FIG. 1A, the sub-blocks 124 within the dummy regions 104 may each include a single (e.g., only one) column of the dummy pillars 154 laterally extending in the Y-direction. In additional embodiments, each of the sub-blocks 124 within the dummy regions 104 of the semiconductive device structure 100 includes a different quantity of the dummy pillars 154 than that depicted in FIG. 1A, and/or includes a different distribution of the dummy pillars 154 than that depicted in FIG. 1A. For example, each of the sub-blocks 124 within the dummy regions 104 of the semiconductive device structure 100 may include multiple (e.g., more than one (1), such as two (2), three (3), four (4), or more than four (4)) columns of the dummy pillars 154 laterally extending in the Y-direction.

As shown in FIG. 1A, the dummy regions 104 of the semiconductive device structure 100 may also include the edge support structures 152 longitudinally extending (e.g., in the Z-direction shown in FIG. 1B) through the portions of the blocks 108 located therein. If present, the edge support structures 152 may substantially longitudinally extend through the portions of the blocks 108 present within the dummy regions 104 of the semiconductive device structure 100. The edge support structures 152 (if any) may support edge portions of the tiers 116 (FIG. 1B) of conductive structures 112 (FIG. 1B) and insulating structures 114 (FIG. 1B) within the blocks 108 at least partially located within the dummy regions 104 of the semiconductive device structure 100.

For clarity and ease of understanding of the drawings and related description, FIG. 1A shows the semiconductor device structure 100 as including two (2) dummy regions 104, each including a portion (e.g., a single sub-block 124) of a single block 108 exhibiting dummy pillars 154 longitudinally extending therethrough. However, the semiconductor device structure 100 may include a different quantity of dummy regions 104 (e.g., only one (1) dummy region 104, more than two (2) dummy regions 104); and/or one or more of the dummy regions 104 may include a different individual block area allotment and/or a different quantity of blocks 108 (e.g., an entirety of only one (1) block 108, more than one (1) entire block 108, at least one (1) entire block 108 and only a portion (e.g., sub-block 124) of at least one additional block 108) therein. The quantity of dummy regions 104, and the individual block area allotment and/or quantity of blocks 108 included in each of the dummy regions 104 may at least partially depend on the quantity of memory strings 142 included in the semiconductor device structure 100 (e.g., a relatively greater quantity of memory strings 142 may effectuate a relatively greater quantity of dummy regions 104, and/or may effectuate a relatively greater individual block allotment and/or quantity of blocks 108 within the dummy regions 104).

With returned reference to FIG. 1B, the data line contact region 106 of the semiconductive device structure 100 may laterally neighbor (e.g., in the X-direction) the dummy regions 104. The data line contact region 106 may include through vias 156 (e.g., through array vias (TAVs)) longitudinally extending (e.g., in the Z-direction) through portions of the blocks 108 and the source line 138 located therein. The through vias 156 may substantially longitudinally extend between the control logic structure 136 and the data lines 140, and may be at least partially filled with one or more data line contacts 158. The data line contacts 158 may also substantially longitudinally extend between the control logic structure 136 and the data lines 140. The data line contacts 158 may be formed of and include one or more conductive materials (e.g., a conductively-doped semiconductor, a metal, a metal alloy, a conductive metal-containing material, a combination thereof), and may electrically couple the data lines 140 to the control logic structure 136.

Portions of the blocks 108 within the data line contact region 106 of the semiconductive device structure 100 may include any quantities, lateral geometric configurations (e.g., lateral sizes, lateral shapes), and distributions of the through vias 156 permitting each of the data lines 140 of the semiconductive device structure 100 to be electrically coupled to the control logic structure 136 by way of at least one of the data line contacts 158 longitudinally extending through the through vias 156. In some embodiments, the data line contact region 106 shares two (2) of the blocks 108 of the semiconductive device structure 100 with the dummy regions 104, such that only one (1) of the sub-blocks 124 of each of the two (2) shared blocks 108 is located within the data line contact region 106 and includes through vias 156 longitudinally extending therethrough; and also includes one (1) unshared block 108, such that both of the sub-blocks 124 of the unshared block 108 include through vias 156 longitudinally extending therethrough. As shown in FIG. 1A, the sub-blocks 124 within the data line contact region 106 may each include a single (e.g., only one) column of the through vias 156 laterally extending in the Y-direction, and each of the through vias 156 may be laterally sized, laterally shaped, and laterally positioned to accept at least one of the data line contacts 158 therein. Accordingly, the data line contact region 106 may include four (4) columns of the through vias 156 therein (i.e., one (1) column of the through vias 156 for each of the four (4) sub-blocks 124 included in the data line contact region 106). In additional embodiments, one or more (e.g., each) of the sub-blocks 124 within the data line contact region 106 of the semiconductive device structure 100 includes a different quantity (e.g., more, less) of the through vias 156 than that depicted in FIG. 1A, different lateral geometric configurations (e.g., different lateral sizes, different lateral shapes) of the through vias 156 than that depicted in FIG. 1A, and/or a different distribution (e.g., different lateral positions) of the through vias 156 than that depicted in FIG. 1A. For example, one or more of the sub-blocks 124 within the data line contact region 106 of the semiconductive device structure 100 may include a single (e.g., only one) column of through vias 156 laterally extending in the Y-direction, wherein a single column exhibits a different quantity, different lateral sizes, different lateral shapes, and/or different lateral spacing in the Y-direction than that shown in FIG. 1A; and/or one or more of the sub-blocks 124 within the data line contact region 106 may include multiple (e.g., more than one (1), such as two (2), three (3), four (4), or more than four (4)) columns the through vias 156 laterally extending in the Y-direction.

As previously mentioned, the data line contacts 158 are laterally positioned within and longitudinally extend through the through vias 156. The quantity of data line contacts 158 included in each of the through vias 156 of the data line contact region 106 at least partially depends on the quantity, lateral geometric configurations (e.g., lateral sizes, lateral shapes), and distributions (e.g., lateral positions in at least the Y-direction) of the through vias 156; and the quantity, lateral geometric configurations, and distributions of the data lines 140 of the semiconductive device structure 100. In turn, the quantity, lateral geometric configurations, and distributions of the data lines 140 at least partially depends on the quantity, lateral geometric configurations, and distributions of the memory strings 142 included in the memory regions 102 of the semiconductive device structure 100. As shown in FIG. 1A, the data lines 140 laterally extend in a direction (e.g., the X-direction) orthogonal to a direction (e.g., the Y-direction) in which the blocks 108 of the semiconductive device structure 100 laterally extend, and the semiconductive device structure 100 includes enough of the data lines 140 to electrically connect at least one data line 140 to all of the memory strings 142 included in the memory regions 102 of the semiconductive device structure 100. A data line 140 may be provided at each lateral location in the Y-direction exhibiting at least one of the memory strings 142, may be electrically coupled to all of the memory strings 142 sharing the same lateral location in the Y-direction, and may also be electrically coupled to at least one data line contact 158 within the data line contact region 106. As shown in FIG. 1A, in some embodiments, each of the through vias 156 individually contains a single (e.g., only one (1)) data line contact 158 (corresponding to a single data line 140) within the lateral boundaries thereof. In some embodiments, such as embodiments exhibiting one or more of relatively closer packing of memory strings 142 in the Y-direction and/or relatively larger lateral dimensions of the through vias 156, one or more (e.g., each) of the through vias 156 individually contains multiple (e.g., more than one (1), such as at least two (2), at least three (3), at least four (4), or more than four (4)) data line contacts 158 (corresponding to multiple data lines 140) within the lateral boundaries thereof.

As shown in FIG. 1A, the data line contact region 106 of the semiconductive device structure 100 may also include the edge support structures 152 longitudinally extending (e.g., in the Z-direction shown in FIG. 1B) through portions of one or more of the blocks 108 at least partially located therein. If present, the edge support structures 152 may substantially longitudinally extend through the portions of the blocks 108 present within the data line contact region 106 of the semiconductive device structure 100. The edge support structures 152 (if any) may support edge portions of the tiers 116 (FIG. 1B) of conductive structures 112 (FIG. 1B) and insulating structures 114 (FIG. 1B) within the blocks 108 at least partially located within the data line contact region 106.

For clarity and ease of understanding of the drawings and related description, FIG. 1A shows the semiconductor device structure 100 as including one (1) data line contact region 106, including portions (e.g., sub-blocks 124) of two (2) blocks 108 shared with two (2) dummy regions 104 laterally-neighboring (e.g., in the X-direction) the data line contact region 106, and one (1) block 108 unshared with the other regions of the semiconductor device structure 100. However, the semiconductor device structure 100 may include a different quantity of data line contact regions 106 (e.g., more than one (1) data line contact region 106); and/or the data line contact region(s) 106 may include a different individual block area allotment and/or a different quantity of blocks 108 therein. The quantity of data line contact regions 106, and the individual block area allotment and/or quantity of blocks 108 included in the data line contact region(s) 106 may at least partially depend on the quantity of memory strings 142 included in the semiconductor device structure 100 (e.g., a relatively greater quantity of memory strings 142 may effectuate a relatively greater quantity of data line contact regions 106, and/or may effectuate a relatively greater individual block allotment and/or quantity of blocks 108 within the data line contact region(s) 106).

Thus, in accordance with embodiments of the disclosure, a semiconductor device structure comprises blocks having substantially uniform pitch laterally-extending throughout a first region, a second region laterally-neighboring the first region, and a third region laterally-neighboring the second region; memory strings longitudinally-extending through a first portion of the blocks located in the first region; pillars structures longitudinally-extending through a second portion of the blocks located in the second region; conductive contacts longitudinally-extending through a third portion of the blocks located in the third region; and conductive line structures electrically coupled to and laterally-extending between the memory strings and the conductive contacts. Each of the blocks comprises tiers, each tier comprising a conductive structure and an insulating structure longitudinally-neighboring the conductive structure.

In addition, in accordance with additional embodiments of the disclosure, a semiconductor device comprises an alternating pattern of blocks and slots laterally-extending substantially uniformly throughout each of at least one memory region, at least one dummy region, and at least one data line contact region; vertical memory strings extending through one or more of the blocks at least partially located within the at least one memory region; vertical pillars extending through one or more of the blocks at least partially located within the at least one dummy region; vertical data line contacts extending through one or more of the blocks at least partially located within the at least one data line contact region; and data lines extending between the vertical memory strings and the vertical data line contacts. Each of the blocks comprises tiers each comprising a conductive structure and an insulating structure vertically-neighboring the conductive structure; and a staircase structure having steps comprising lateral ends of the tiers.

Figure 2:
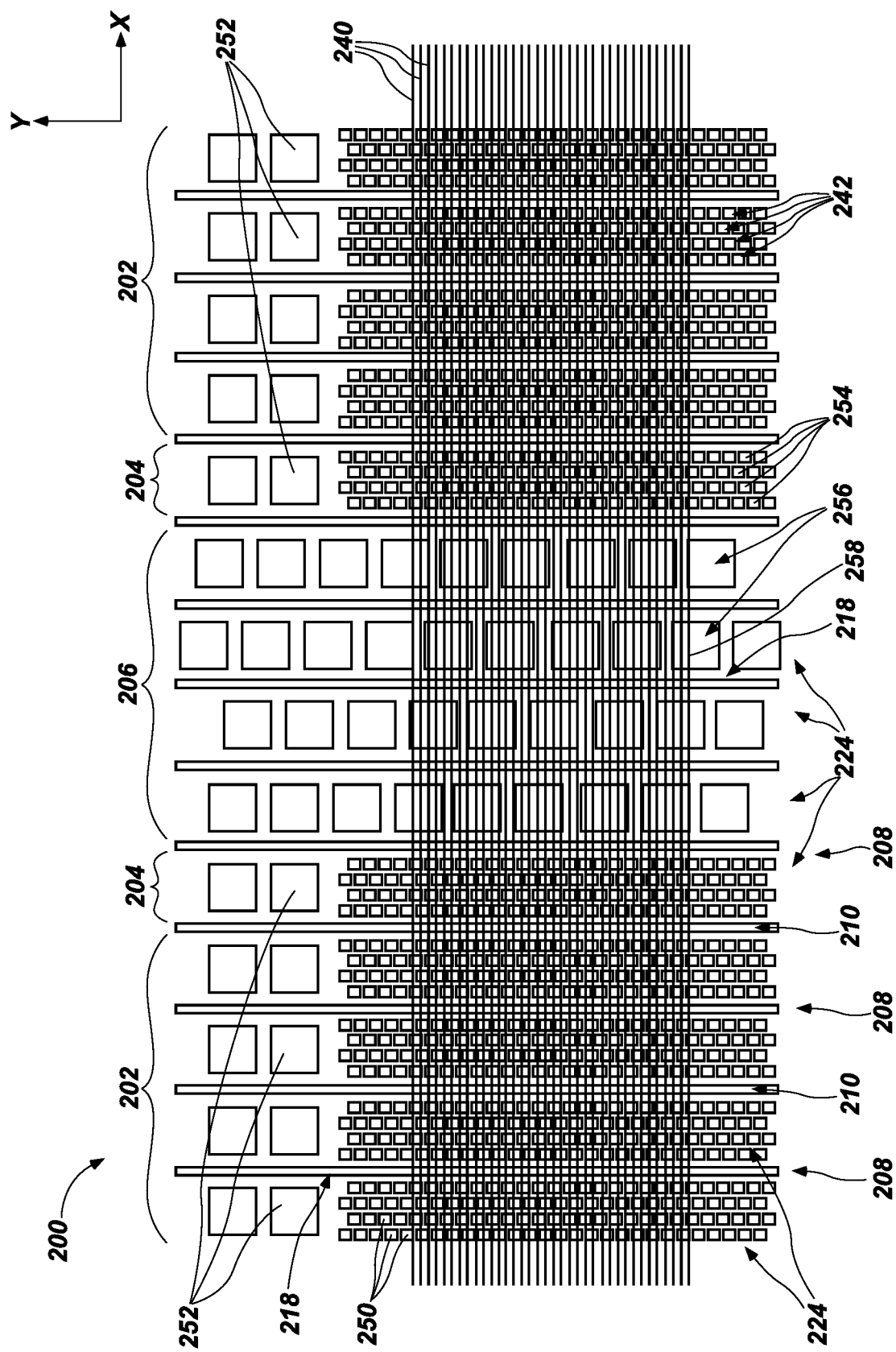
FIG. 2 is a simplified, partial top-down view of a semiconductor device structure, in accordance with additional embodiments of the disclosure.

One of ordinary skill in the art will appreciate that, in accordance with additional embodiments of the disclosure, the features and feature configurations described above in relation to FIGS. 1A through 1C may be readily adapted to the design needs of different semiconductor devices (e.g., different memory devices, such as different 3D NAND Flash memory devices). By way of non-limiting example, FIG. 2 illustrates a simplified, partial top-down view of a semiconductor device structure 200, in accordance with another embodiment of the disclosure. The semiconductor device structure 200 may have similar features and functionalities to the semiconductor device structure 100 previously described. However, the semiconductor device structure 200 may, for example, include a relatively greater quantity of features (e.g., memory strings, dummy pillars, through vias, data line contacts, edge support structures, dummy structures) and/or different feature configurations (e.g., sizes, shapes, arrangements) to account for the relatively greater quantity of features. To avoid repetition, not all features shown in FIG. 2 are described in detail herein. Rather, unless described otherwise below, features designated by a reference numeral that is a 100 increment of the reference numeral of a feature described previously in relation to one or more of FIGS. 1A through 1C will be understood to be substantially similar to the feature described previously.

Referring to FIG. 2, the semiconductor device structure 200 includes a relatively greater (as compared to the semiconductor device structure 100 shown in FIGS. 1A through 1C) quantity of memory strings 242 within the blocks 208 located in the memory regions 202 thereof. For example, each of the sub-blocks 224 of each of the blocks 208 within the memory regions 202 of the semiconductor device structure 200 may include multiple columns of the memory strings 242 laterally extending in the Y-direction. As shown in FIG. 2, in some embodiments, each of the sub-blocks 224 of each of the blocks 208 within the memory regions 202 includes four (4) columns of the memory strings 242. In addition, laterally-neighboring (e.g., in the X-direction) memory strings 242 within laterally-neighboring (e.g., in the X-direction) columns may be laterally offset from (e.g., in the Y-direction) from one another, such that the laterally-neighboring memory strings 242 within the laterally-neighboring columns are at least partially unaligned with one another. The blocks 208 located in the memory regions 202 of the semiconductor device structure 200 may also include relatively greater quantities of dummy structures 250 and edge support structures 252 as compared to the semiconductor device structure 100 shown in FIGS. 1A through 1C. For example, each of the sub-blocks 224 of each of the blocks 208 within the memory regions 202 of the semiconductor device structure 200 may include multiple (e.g., four (4)) columns of the dummy structures 250 laterally extending in the Y-direction, as well as multiple (e.g., two (2)) edge support structures 252 proximate lateral ends (e.g., in the Y-direction) thereof.

The semiconductor device structure 200 further includes a relatively greater (as compared to the semiconductor device structure 100 shown in FIGS. 1A through 1C) quantity of data lines 240 as a result of the relatively greater quantity of memory strings 242 in the memory regions 202 thereof. In turn, the relatively greater quantity of data lines 240 effectuates greater quantities and different distributions (e.g., closer lateral spacing in the Y-direction) of through vias 256 and data line contacts 258 longitudinally extending through portions (e.g., sub-blocks 224) of the blocks 208 located in the data line contact region 206 of the semiconductor device structure 200. In addition, one or more of the through vias 256 in the data line contact region 206 may contain multiple data line contacts 258 within the lateral boundaries thereof.

With continued reference to FIG. 2, the semiconductor device structure 200 also includes a relatively greater (as compared to the semiconductor device structure 100 shown in FIGS. 1A through 1C) quantity of dummy pillars 254 within the portions (e.g., sub-blocks 224) of the blocks 208 located in the dummy regions 204 thereof. For example, each of the sub-blocks 224 within the dummy regions 204 of the semiconductor device structure 200 may include multiple columns of the dummy pillars 254 laterally extending in the Y-direction. As shown in FIG. 2, in some embodiments, each of the sub-blocks 224 within the dummy regions 204 includes four (4) columns of the dummy pillars 254. In addition, laterally-neighboring (e.g., in the X-direction) dummy pillars 254 within laterally-neighboring (e.g., in the X-direction) columns may be laterally offset from (e.g., in the Y-direction) from one another, such that the laterally-neighboring dummy pillars 254 within the laterally-neighboring columns are at least partially unaligned with one another. The portions (e.g., sub-blocks 224) of the blocks 208 located in the dummy regions 204 of the semiconductor device structure 200 may also include relatively greater quantities of the edge support structures 252 as compared to the semiconductor device structure 100 shown in FIGS. 1A through 1C. For example, each of the sub-blocks 224 within the dummy regions 204 of the semiconductor device structure 200 may include multiple (e.g., two (2)) edge support structures 252 proximate lateral ends (e.g., in the Y-direction) thereof.

Figure 3:
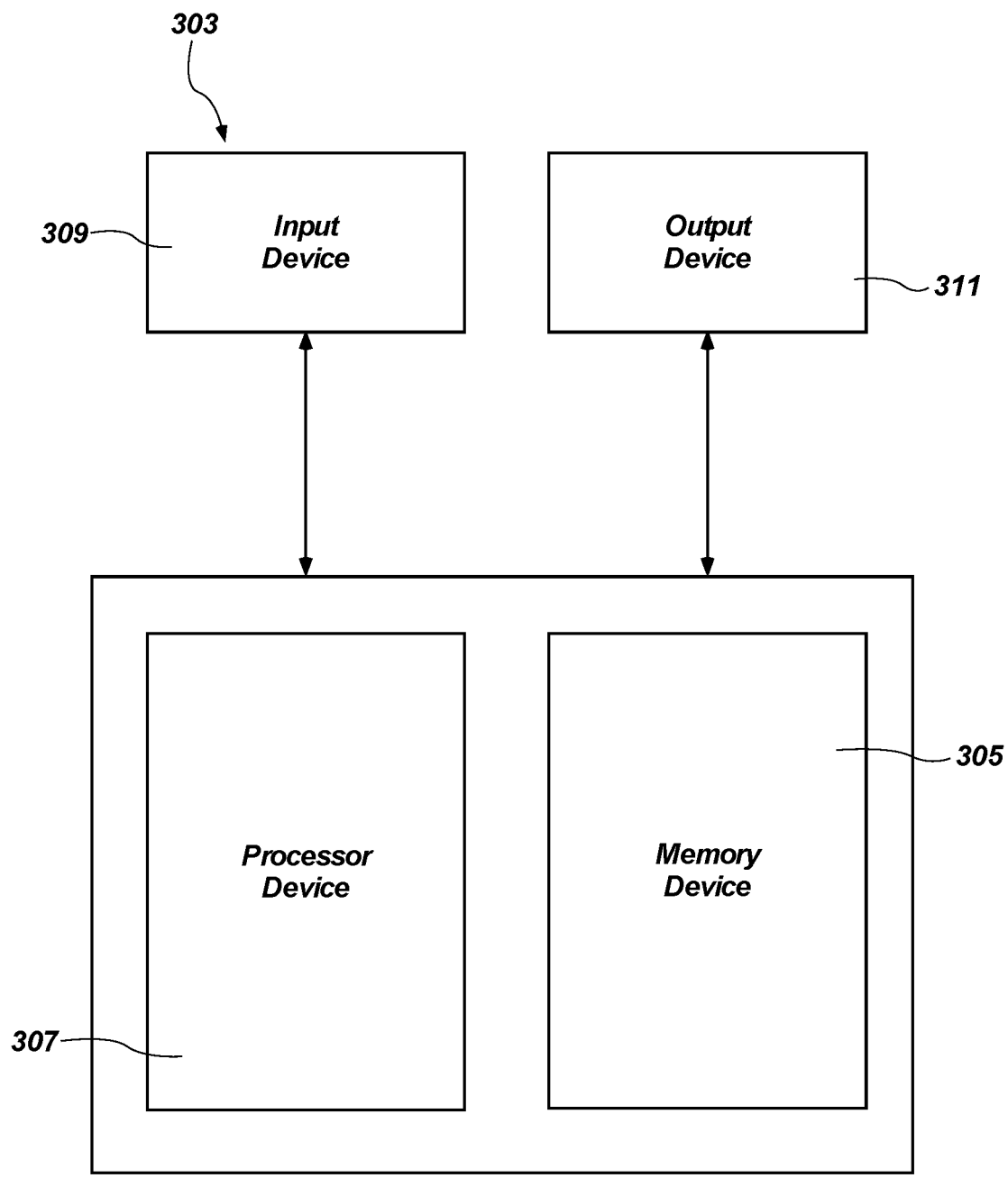
FIG. 3 is a schematic block diagram illustrating an electronic system, in accordance with embodiments of the disclosure.

Semiconductor device structures (e.g., the semiconductor device structures 100, 200) in accordance with embodiments of the disclosure may be used in embodiments of electronic systems of the disclosure. For example, FIG. 3 is a block diagram of an illustrative electronic system 303 according to embodiments of disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of a semiconductor device structure previously described herein (e.g., the semiconductor device structures 100, 200). The electronic system 303 may further include at least one electronic signal processor device 307 (often referred to as a "microprocessor"). The electronic signal processor device 307 may, optionally, include an embodiment of a semiconductor device structure previously described herein (e.g., the semiconductor device structures 100, 200). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Thus, in accordance with embodiments of the disclosure, an electronic system comprises an input device, an output device, a processor device operably coupled to the input device and the output device, and a memory device operably coupled to the processor device. The memory device comprises a control logic structure; a source line overlying the control logic structure; data lines overlying the source line; an array of blocks between the source line and the data lines and laterally extending throughout a memory region, a dummy region laterally-neighboring the memory region, and a data line contact region laterally-neighboring the dummy region; memory strings substantially vertically extending from the data lines, through the blocks of the array within the memory region, and to the source line; dummy pillars substantially vertically extending through the blocks of the array within the dummy region; and data line contacts comprising a conductive material substantially vertically extending from the data lines, through the blocks of the array within the data line contact region, and to the control logic structure. The blocks of the array are substantially uniformly laterally spaced and each comprises tiers each comprising a conductive structure and an insulating structure vertically-neighboring the conductive structure.

The structures, devices, and systems of the disclosure advantageously facilitate one or more of improved simplicity, improved yield, greater packaging density, and increased miniaturization of components as compared to conventional structures, conventional devices, and conventional systems. For example, the configurations of the semiconductor device structures (e.g., the semiconductor device structures 100, 200) of the disclosure (including the configurations of the blocks) facilitate reduced lateral dimensions of regions (e.g., dummy regions, data line contact regions) thereof relative to conventional semiconductor device structure configurations, to facilitate relatively smaller lateral dimensions for each of the semiconductor device structures as a whole, while improving yield by reducing damage and/or defects associated with at least memory array edge effects.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:
1. A device, comprising:
a block array comprising blocks extending in parallel in a first horizontal direction and separated from one another in a second horizontal direction orthogonal to the first horizontal direction, each of the blocks comprising vertically alternating conductive structures and insulating structures arranged in tiers;
strings of memory cells vertically extending through a first block of the block array within a memory region;
data line contacts vertically extending through a second block of the block array within a data line contact region;
dummy pillars vertically extending through a third block of the block array within a dummy region interposed between the memory region and the data line contact region in the second horizontal direction; and data lines extending in the second horizontal direction between the strings of memory cells and the data line contacts.

2. The device of claim 1, further comprising a control logic structure vertically underlying the block array and electrically coupled to the data line contacts.

3. The device of claim 1, wherein the blocks of the block array are substantially uniformly sized and shaped relative to one another.

4. The device of claim 1, wherein the third block of the block array is shared between the dummy region and the data line contact region.

5. The device of claim 4, wherein:
a first sub-block of the third block of the block array exhibits a column of the dummy pillars extending in the first horizontal direction; and
a second sub-block of the third block of the block array exhibits a column of additional data line contacts extending in the first horizontal direction.

6. The device of claim 1, wherein the first block of the block array further comprises a staircase structure having steps comprising horizontal ends of the conductive structures of the first block of the block array.

7. The device of claim 6, further comprising access line contacts vertically extending from the steps of the staircase structure.

8. The device of claim 1, wherein the dummy pillars comprise one or more of dielectric pillars and semiconductive pillars.

9. A memory device, comprising:
a pair of memory regions;
a pair of dummy regions horizontally between the pair of memory regions;
a data line contact region horizontally between the pair of dummy regions;
substantially uniformly spaced blocks each comprising vertically neighboring tiers each having a conductive structure and an insulating structure vertically neighboring the conductive structure, the substantially uniformly spaced blocks comprising:
first blocks within the pair of memory regions;
second blocks within the pair of dummy regions; and
a third block within data line contact region;
memory strings vertically extending through the first blocks;
pillar structures vertically extending through the second blocks;
data line contacts vertically extending through the third block; and
data lines extending between and electrically coupling the memory strings and the data line contacts.

10. The memory device of claim 9, wherein the pillar structures are electrically isolated from the data lines.

11. The memory device of claim 9, wherein the pillar structures comprise one or more of a dielectric material and a semiconductive material.

12. The memory device of claim 9, wherein columns of the pillar structures extending across the second blocks in a first horizontal direction are interposed in a second horizontal direction between additional columns of the memory strings extending across the first blocks in the first horizontal direction and further columns of the data line contacts extending across the third block in the first horizontal direction.

13. The memory device of claim 9, further comprising:
a source structure vertically underlying the substantially uniformly spaced blocks; and
a control logic structure vertically underlying the source structure.

14. The memory device of claim 13, wherein the data line contacts vertically extend from and between the data lines and the control logic structure.

15. The memory device of claim 9, wherein each of the substantially uniformly spaced blocks further comprises:
a pair of upper select gate structures vertically overlying the vertically neighboring tiers and defining horizontal boundaries of sub-blocks; and
a lower select gate structure vertically underlying the vertically neighboring tiers.

16. The memory device of claim 15, further comprising:
a control logic structure electrically coupled to the data line contacts; and
select lines electrically coupled to the control logic structure and each of the lower select gate structure and the pair of upper select gate structures of the first blocks.

17. The memory device of claim 16, wherein each of the first blocks further comprises a staircase structure having steps comprising horizontal ends of the vertically neighboring tiers.

18. The memory device of claim 17, further comprising:
access line contacts on the steps of the staircase structure; and
access lines electrically coupled to the access line contacts and the control logic structure.

19. An electronic system, comprising:
an input device;
an output device;
a processor device operably coupled to the input device and the output device; and
a memory device operably coupled to the processor device and comprising:
a control logic structure;
a source structure vertically overlying the control logic structure;
data lines vertically overlying the source structure;
a block array vertically between the source structure and the data lines and comprising blocks horizontally extending in parallel in a first direction and horizontally separated from one another in a second direction orthogonal to the first direction, each of the blocks comprising vertically alternating conductive structures and insulating structures;
strings of memory cells electrically coupled to the source structure and the data lines and vertically extending through at least one block of the block array located within at least one memory region;
data line contacts electrically coupled to the data lines and the control logic structure and vertically extending through at least one other block of the block array located within at least one data line contact region; and
dummy pillars vertically extending through at least one additional block of the block array located within at least one dummy region horizontally intervening in the second direction between the at least one memory region and the at least one data line contact region.

20. The electronic system of claim 19, wherein the memory device comprises a 3D NAND Flash memory device.

* * * * *